(12) United States Patent
Cousins

(10) Patent No.: US 8,207,444 B2
(45) Date of Patent: Jun. 26, 2012

(54) FRONT CONTACT SOLAR CELL WITH FORMED ELECTRICALLY CONDUCTING LAYERS ON THE FRONT SIDE AND BACKSIDE

(75) Inventor: Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 144 days.

(21) Appl. No.: 12/166,266

(22) Filed: Jul. 1, 2008

(65) Prior Publication Data

US 2010/0000597 A1 Jan. 7, 2010

(51) Int. Cl.
*H01L 31/0368* (2006.01)
*H01L 331/028* (2006.01)

(52) U.S. Cl. ........ 136/258; 136/252; 136/256; 136/261; 438/97

(58) Field of Classification Search ........... 136/243–265
See application file for complete search history.

(56) References Cited

U.S. PATENT DOCUMENTS

| | | | |
|---|---|---|---|
| 3,961,997 A | 6/1976 | Chu | |
| 4,927,770 A | 5/1990 | Swanson | |
| 5,030,295 A * | 7/1991 | Swanson et al. | 136/256 |
| 5,053,083 A | 10/1991 | Sinton | |
| 5,057,439 A * | 10/1991 | Swanson et al. | 438/98 |
| 5,164,019 A | 11/1992 | Sinton | |
| 5,217,539 A | 6/1993 | Fraas et al. | |
| 5,360,990 A | 11/1994 | Swanson | |
| 5,369,291 A | 11/1994 | Swanson | |
| 5,620,904 A | 4/1997 | Hanoka | |
| 5,641,362 A | 6/1997 | Meier | |
| 5,693,578 A * | 12/1997 | Nakanishi et al. | 438/770 |
| 6,262,359 B1 * | 7/2001 | Meier et al. | 136/256 |
| 6,274,402 B1 | 8/2001 | Verlinden et al. | |
| 6,313,395 B1 | 11/2001 | Crane et al. | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |

(Continued)

FOREIGN PATENT DOCUMENTS

WO WO 2008/004791 * 1/2008

OTHER PUBLICATIONS

Mueller et al., High Quality Passivation for heterojunction Solar Cells by Hdrogenated Amorphous Sili on Suboxide Films, Applied Physics Letters, vol. 92, pp. 1-3, Jan. 23, 2008.*

(Continued)

*Primary Examiner* — Jeffrey T Barton
*Assistant Examiner* — Jayne Mershon
(74) *Attorney, Agent, or Firm* — Okamoto & Benedicto LLP

(57) ABSTRACT

A bipolar solar cell includes a backside junction formed by a silicon substrate and a first doped layer of a first dopant type on the backside of the solar cell. A second doped layer of a second dopant type makes an electrical connection to the substrate from the front side of the solar cell. A first metal contact of a first electrical polarity electrically connects to the first doped layer on the backside of the solar cell, and a second metal contact of a second electrical polarity electrically connects to the second doped layer on the front side of the solar cell. An external electrical circuit may be electrically connected to the first and second metal contacts to be powered by the solar cell.

11 Claims, 10 Drawing Sheets

U.S. PATENT DOCUMENTS

| | | | |
|---|---|---|---|
| 6,423,568 | B1 | 7/2002 | Verlinden et al. |
| 6,638,788 | B2* | 10/2003 | Emoto et al. ............... 438/88 |
| 6,998,288 | B1 | 2/2006 | Smith et al. |
| 7,135,350 | B1 | 11/2006 | Smith et al. |
| 7,468,485 | B1* | 12/2008 | Swanson ............... 136/243 |
| 2004/0200520 | A1 | 10/2004 | Mulligan et al. |
| 2005/0016585 | A1* | 1/2005 | Munzer ............... 136/261 |
| 2006/0096635 | A1* | 5/2006 | Tuttle ............... 136/262 |
| 2006/0185716 | A1* | 8/2006 | Murozono et al. ............ 136/250 |
| 2007/0023081 | A1* | 2/2007 | Johnson et al. ............ 136/258 |
| 2008/0078444 | A1 | 4/2008 | Atanackovic |
| 2008/0173347 | A1* | 7/2008 | Korevaar et al. ............ 136/255 |
| 2009/0159111 | A1* | 6/2009 | Jawarani et al. ............ 136/244 |
| 2011/0114171 | A1* | 5/2011 | Meier et al. ............ 136/256 |

OTHER PUBLICATIONS

Wang et al., Toward Better Understanding and Improved Performance of Silicon Heterojunction Solar Cells, National Renwable Energy Laboratory, conference paper for Workshop on Crystalline Silicon Solar Cells and Modules, Winter Park, Colorado, CP-250-36669, pp. 1-11, 2004.*

PCT International Search Report for Application No. PCT/US2009/048295, Aug. 17, 2009 (2 sheets).

W.P. Mulligan, et al., "A Flat-Plate Concentrator: Micro-Concentrator Design Overview", 2000, 3 sheets, Proceedings of the 28th IEEE PVSC.

K. R. McIntosh, et al., " The Choice of Silicon Wafer for the Production of Low-Cost Rear-Contact Solar Cells", May 2003, 4 sheets, Sunpower Corporation, Sunnyvale, CA.

P.J. Verlinden, et al., " Will We have a 20%-Efficient(PTC) Photovoltaic System?", 2001, 6 sheets, Proceedings of the 17th Europe Photovoltaic Solar Energy Conference.

William P. Mulligan, et al., " Development of Chip-Size Silicon Solar Cells", 2000, 6 sheets, Proceedings of the 28th IEEE PVSC.

Akira Terao, et al., "A Mirror-Less Design for Micro-Concentrator Modules", 2000, 4 sheets, Proceedings of the 28th IEEE PVSC.

P.J. Verlinden, et al., "Backside-Contact Silicon Solar Cells with Improved Efficiency for the '96 World Solar Challenge", 1997, 5 sheets, Proceedings of the 15th EPSEC.

P.J. Verlinden, et al., "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson "The Promise of Concentrators", 2000, Prog. Photovolt. Res. Appl. 8, pp. 93-111.

Ronald A. Sinton, et al., "Simplified Backside-Contact Solar Cells", Feb. 1990, pp. 348-352, IEEE Transactions on Electron Devices, vol. 37. No. 2.

Ronald A. Sinton "Device Physics and Characterization of Silicon Point-Contact Solar Cells", Feb. 1997, pp. 1-154, Stanford Electronics Laboratories, Stanford University, CA.

Richard Roland King "Studies of Oxide-Passivated Emitters in Silicon and Applications to Solar Cells", Aug. 1990, pp. 1-200, (Thesis) Electrical Engineering Department of Stanford University, CA.

* cited by examiner

FRONT CONTACT SOLAR CELL WITH FORMED ELECTRICALLY CONDUCTING LAYERS ON THE FRONT SIDE AND BACKSIDE

STATEMENT REGARDING FEDERALLY SPONSORED RESEARCH OR DEVELOPMENT

The invention described herein was made with Governmental support under contract number DE-FC36-07G017043 awarded by the United States Department of Energy. The Government may have certain rights in the invention.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type diffusion regions that form a junction. Solar radiation impinging on the solar cell creates electrons and holes that migrate to the diffusion regions, thereby creating voltage differentials between the diffusion regions. In a backside contact solar cell, both the diffusion regions and the metal contacts coupled to them are all on the backside of the solar cell. The metal contacts allow an external electrical circuit to be coupled to and be powered by the solar cell.

In a front contact solar cell, at least one of the metal contacts making an electrical connection to a diffusion region is on the front side of the solar cell. While backside contact solar cells have an aesthetic advantage over front contact solar cells due to the absence of metal contacts on the front side, and are thus preferred for residential applications, aesthetics is not a major requirement for power plants and other applications where power generation is the main concern. Disclosed herein are structures for a relatively efficient and cost-effective front contact solar cell and processes for manufacturing same.

SUMMARY

In one embodiment, a bipolar solar cell includes a backside junction formed by a silicon substrate and a first doped layer of a first dopant type on the backside of the solar cell. A second doped layer of a second dopant type makes an electrical connection to the substrate from the front side of the solar cell. A first metal contact of a first electrical polarity electrically connects to the first doped layer on the backside of the solar cell, and a second metal contact of a second electrical polarity electrically connects to the second doped layer on the front side of the solar cell. For example, the first doped layer may be polysilicon doped with a P-type dopant, while the second doped layer may be polysilicon doped with an N-type dopant. An external electrical circuit may be electrically connected to the first and second metal contacts to be powered by the solar cell.

These and other features of the present invention will be readily apparent to persons of ordinary skill in the art upon reading the entirety of this disclosure, which includes the accompanying drawings and claims.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention pertains to a low cost, high-efficiency front contact solar cell. Another such front contact solar cell is also disclosed in commonly-owned U.S. application Ser. No. 12/070,742, entitled "FRONT CONTACT SOLAR CELL WITH FORMED EMITTER," filed by Peter John Cousins on Feb. 20, 2008, having Express Mail No. EM142856406US.

Figure 1:
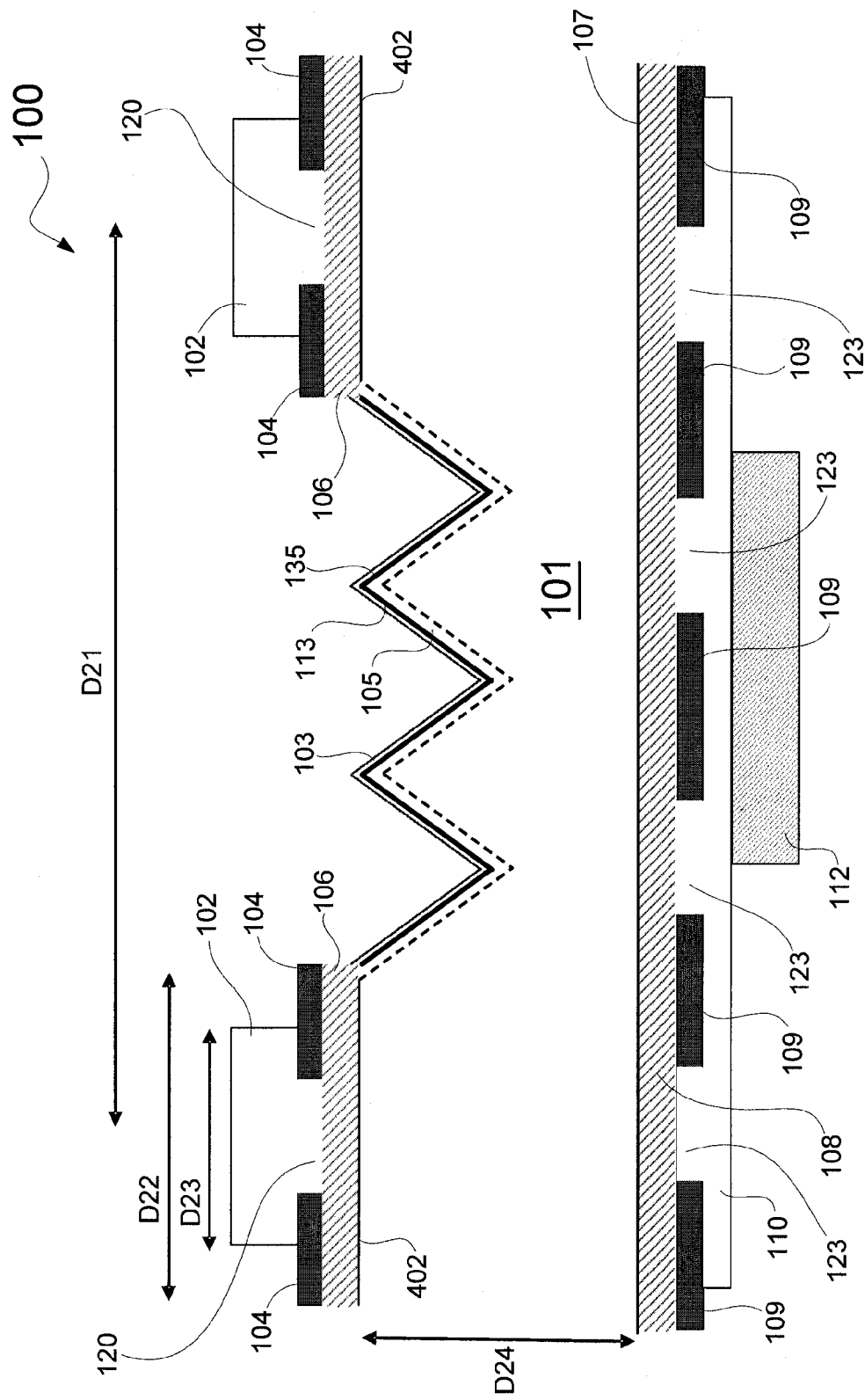
FIG. 1 schematically shows a cross-section of a solar cell in accordance with an embodiment of the present invention.

FIG. 1 schematically shows a cross-section of a bipolar front contact solar cell 100 in accordance with an embodiment of the present invention. The solar cell 100 has a front side where metal contacts 102 are located and a backside on a same side as the metal contact 110. The front side, which is opposite the backside, faces the sun during normal operation to collect solar radiation. The front side of the solar cell includes layers formed on the front side surface of a substrate 101, and the backside of the solar cell includes layers formed on the backside surface of the substrate 101.

In the example of FIG. 1, the solar cell 100 includes a backside junction formed by a P-type doped polysilicon layer 108 serving as a P-type diffusion region and the N-type silicon substrate 101 servings as an N-type diffusion region. In one embodiment, the polysilicon layer 108 has an emitter saturation current of about 10 $fA \cdot cm^{-2}$ The N-type silicon substrate 101 may comprise a long lifetime (e.g., 2 to 5 ms) N-type silicon wafer and may have a thickness of about 100 to 250 μm as measured from the backside surface to a tip of the textured front side surface of the substrate (see dimension D24). The front side surface of the substrate 101 may be randomly textured (labeled as 113) and includes an N-type doped region 105 formed in the substrate. The N-type doped region 105 provides low front surface recombination and improves lateral conductivity whilst not compromising the blue response of the solar cell. The N-type doped region 105 may have a sheet resistance of 100 to 500 Ω/sq.

An N-type doped polysilicon layer 106 on the front side of the solar cell 100 provides low contact resistance and minimizes contact recombination. The polysilicon layer 106 is also referred to as an "N-dot" because, in one embodiment, it forms a dot-shape to minimize the area of heavily diffused regions on the front surface of the substrate 101. In one embodiment, the polysilicon layer 106 has an emitter saturation current of about 5 $fa \cdot cm^{-2}$. The polysilicon layer 106 may be formed on a thin dielectric layer 402. The thin dielectric layer 402 may comprise silicon dioxide thermally grown to a thickness of about 10 to 50 Angstroms on the front side surface of the substrate 101. In one embodiment, the thin dielectric layer 402 is not on the textured front side surface 113 because it is removed by the texturing step.

An antireflective coating (ARC) of silicon nitride layer 103 may be formed on the textured front side surface 113 of the substrate 101. The texture front side surface 113 and the antireflective coating help improve solar radiation collection efficiency. A passivating oxide 135 may be formed on the textured front side surface 113 under the silicon nitride layer 103. In one embodiment, the passivating oxide 135 is thermally grown on the textured front side surface of the substrate 101 to a thickness of about 10 to 250 Angstroms.

In one embodiment, the polysilicon layer 108 is formed on a thin dielectric layer 107. The polysilicon layer 108 may be formed by forming a layer of polysilicon by Chemical Vapor Deposition (CVD), such as Low Pressure CVD (LPCVD) or Plasma Enhanced CVD (PECVD), and thermal anneal. The polysilicon layer 108 may have a sheet resistance of about 100 Ω/sq. The thin dielectric layer 107 may comprise silicon dioxide thermally grown to a thickness of about 10 to 50 Angstroms on the backside surface of the substrate 101. A metal contact 110 electrically connects to the polysilicon layer 108 through contact holes 123 formed through a dielectric comprising a silicon dioxide layer 109. The silicon dioxide layer 109 provides electrical isolation and allows the metal contact 110 to serve as an infrared reflecting layer for increased solar radiation collection. As will be more apparent below, the silicon dioxide layer 109 may also serve as a dopant source in the diffusion of dopants into the polysilicon layer 108.

In one embodiment, the metal contact 110 comprises aluminum having a sheet resistance of about 15 mΩ/sq and formed to a thickness of about 10 to 30 μm by a printing process. A bus bar 112 electrically connects to the metal contact 110 to provide a positive polarity terminal for electrically connecting an external electrical circuit to the solar cell 100. In one embodiment, the bus bar 112 comprises silver and has a conductance of about 5-25 mΩ·cm and a thickness of about 15-35 μm.

The metal contact 110 may also comprise a stack of materials comprising aluminum formed towards the substrate 101, a diffusion barrier layer comprising titanium-tungsten formed on the aluminum, and a seed layer of copper formed on the diffusion barrier layer. In that configuration, the bus bar 112 may comprise copper electroplated onto the seed layer.

On the front side of the solar cell 100, each metal contact 102 electrically connects to the polysilicon layer 106 through a contact hole 120 formed through the silicon dioxide layer 104. Similar to the silicon dioxide layer 109, the silicon dioxide layer 104 may serve as a dopant source in diffusing dopants to the polysilicon layer 106. As can be appreciated, the polysilicon layers 108 and 106 may also be pre-doped before formation on the substrate 101.

A metal contact 102 provides a negative polarity terminal to allow an external electrical circuit to be coupled to and be powered by the solar cell 100. In one embodiment, the metal contact 102 comprises silver having a sheet resistance of about 5-25 mΩ·cm and a thickness of about 15-35 μm.

The pitch between adjacent metal contacts 102 separated by a textured front side surface 113 (see dimension D21) may be about 4200 μm. The diameter of a polysilicon layer 104 (see dimension D22) may be about 390 μm.

Figure 2:
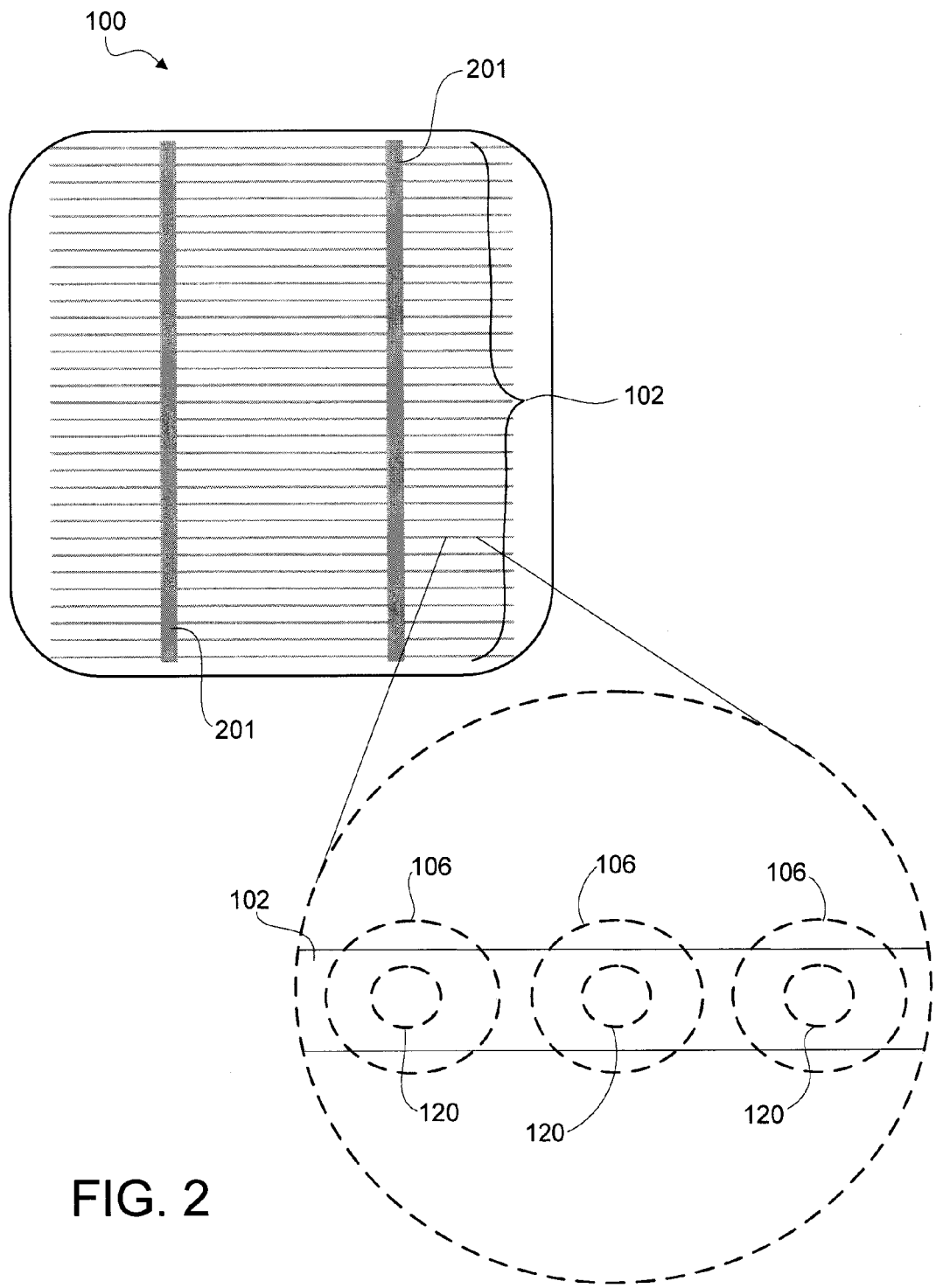
FIG. 2 is a plan view schematically showing the front side of the solar cell of FIG. 1 in accordance with an embodiment of the present invention.

FIG. 2 is a plan view schematically showing the front side of the solar cell 100 in accordance with an embodiment of the present invention. In the example of FIG. 2, two bus bars 201 run parallel on the front side of the substrate 101. The contact holes 120, in which the metal contacts 102 are formed, may each have a diameter of about 50 to 200 μm. A plurality of metal contacts 102 is formed perpendicular to the bus bars 201. Each metal contact 102 may have a width of about 60-120 μm (see dimension D23 in FIG. 1).

Figure 3:
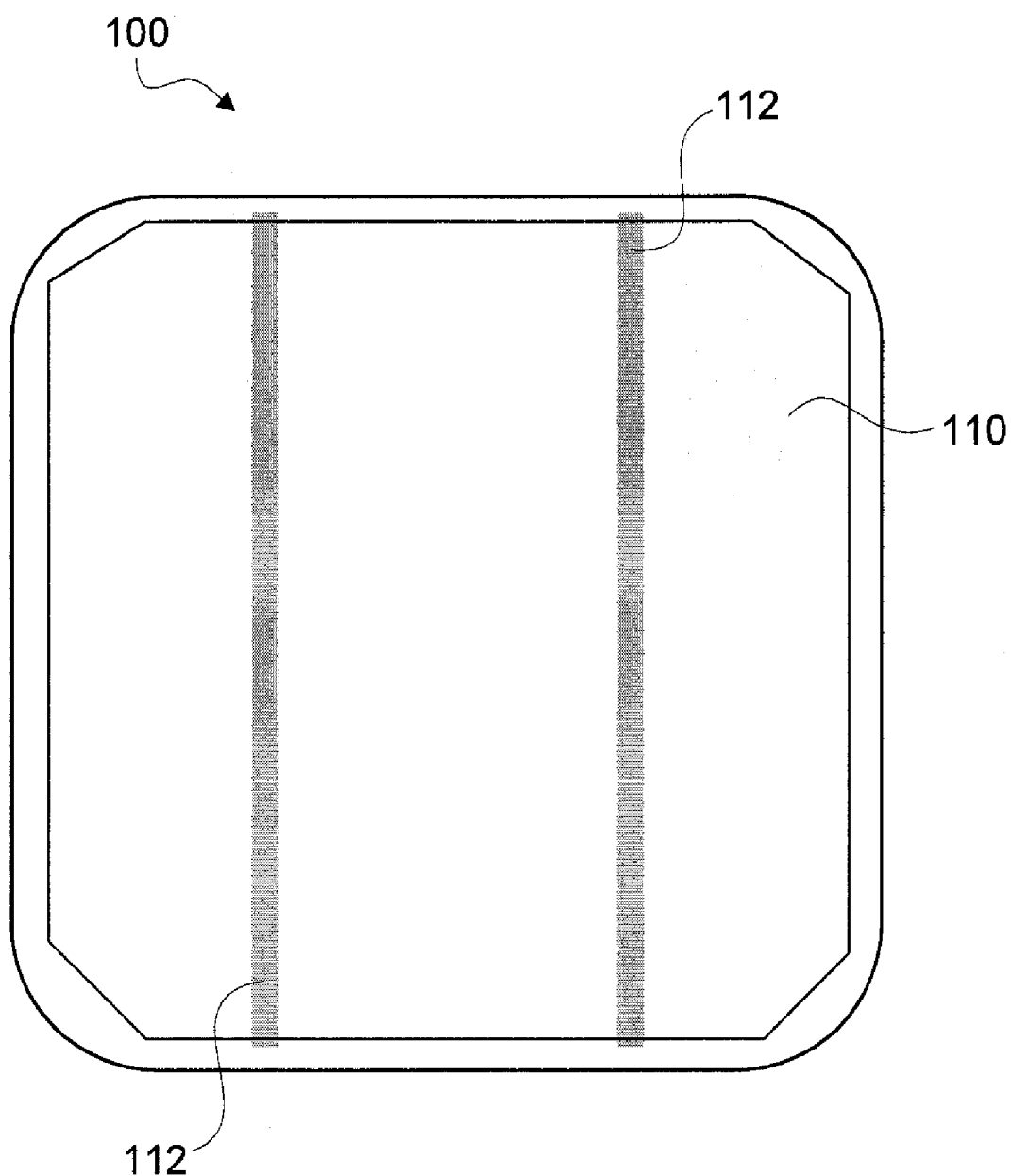
FIG. 3 is a plan view schematically showing the backside of the solar cell of FIG. 1 in accordance with an embodiment of the present invention.

FIG. 3 is a plan view schematically showing the backside of the solar cell 100 in accordance with an embodiment of the present invention. In the example of FIG. 3, the bus bars 112 run parallel on the backside. In practice, the bus bars 201 and 112 will be electrically connected to corresponding bus bars of adjacent solar cells to form an array of solar cells.

Solar cells have gained wide acceptance among energy consumers as a viable renewable energy source. Still, to be competitive with other energy sources, a solar cell manufacturer must be able to fabricate an efficient solar cell at relatively low cost. With this goal in mind, a process for manufacturing the solar cell 100 is now discussed with reference to FIGS. 4-19.

FIGS. 4-19 schematically illustrate the fabrication of the solar cell 100 in accordance with an embodiment of the present invention.

Figure 4:
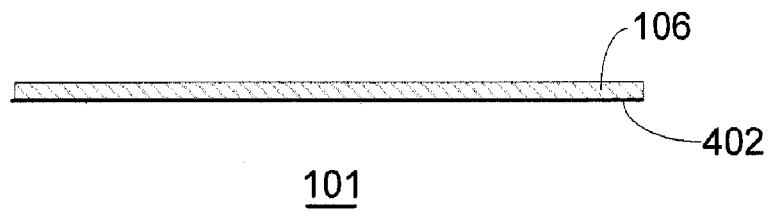
FIGS. 4-19 schematically illustrate the fabrication of the solar cell of FIG. 1 in accordance with an embodiment of the present invention.

In FIG. 4, an N-type silicon substrate 101 is prepared for processing into a solar cell by undergoing a damage etch step. The substrate 101 is in wafer form in this example, and is thus typically received with damaged surfaces due to the sawing process used by the wafer vendor to slice the substrate 101 from its ingot. The substrate 101 may be about 100 to 250 microns thick as received from the wafer vendor. In one embodiment, the damage etch step involves removal of about 10 to 20 μm from each side of the substrate 101 using a wet etch process comprising potassium hydroxide. The damage etch step may also include cleaning of the substrate 101 to remove metal contamination.

Figure 5:
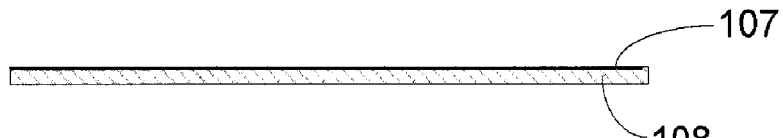

In FIG. 5, thin dielectric layers 402 and 107 are formed on the front and back surfaces, respectively, of the substrate 101. The thin dielectric layers 402 and 107 may comprise silicon dioxide thermally grown to a thickness of about 10 to 50 Angstroms on the surfaces of the N-type silicon substrate 101. A layer of polysilicon is then formed on the thin dielectric layers 402 and 107 to form the polysilicon layer 106 on the front side and the polysilicon layer 108 on the backside, respectively. Each of the polysilicon layer 106 and the polysilicon layer 108 may be formed to a thickness of about 1000 to 2000 Angstroms by CVD.

Figure 6:
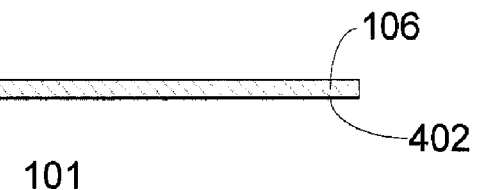

In FIG. 6, a P-type dopant source 403 is formed on the polysilicon layer 108 on the backside of the solar cell. As its name implies, the P-type dopant source 403 provides a source of P-type dopants for diffusion into the polysilicon layer 108 in a subsequent dopant drive-in step. A dielectric capping layer 404 is formed on the P-type dopant source 403 to prevent dopants from escaping from the backside of the solar cell during the drive-in step. In one embodiment, the P-type dopant source 403 comprises BSG (borosilicate glass) deposited to a thickness of about 500 to 1000 Angstroms by atmospheric pressure CVD (APCVD) and has a dopant concentration of 5 to 1% by weight, while the capping layer 404 comprises undoped silicon dioxide formed to a thickness of about 2000 to 3000 Angstroms also by APCVD. Formation of the P-type dopant source 403 and the capping layer 404 may be followed by a cleaning step to remove possible contamination from the front side of the source cell in preparation for formation of an N-type dopant source on the front side of the solar cell.

Figure 7:
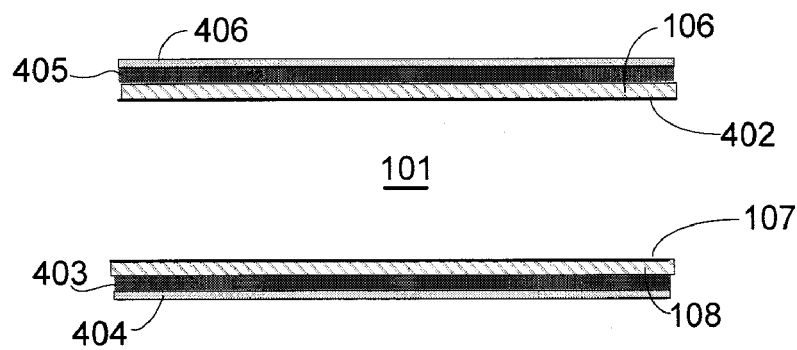

In FIG. 7, an N-type dopant source 405 is formed on the polysilicon layer 106 on the front side of the solar cell. As its name implies, the N-type dopant source 405 provides a source of N-type dopants for diffusion into the polysilicon layer 106 in a subsequent dopant drive-in step. A dielectric capping layer 406 is formed on the N-type dopant source 405 to prevent dopants from escaping from the front side of the solar cell during the drive-in step. In one embodiment, the N-type dopant source 405 comprises PSG (phosphosilicate glass) deposited to a thickness of about 500 to 1000 Angstroms by atmospheric pressure CVD (APCVD) and has a dopant concentration of 5 to 10% by weight, while the capping layer 406 comprises undoped silicon dioxide formed to a thickness of about 2000 to 3000 Angstroms also by APCVD.

Figure 8:
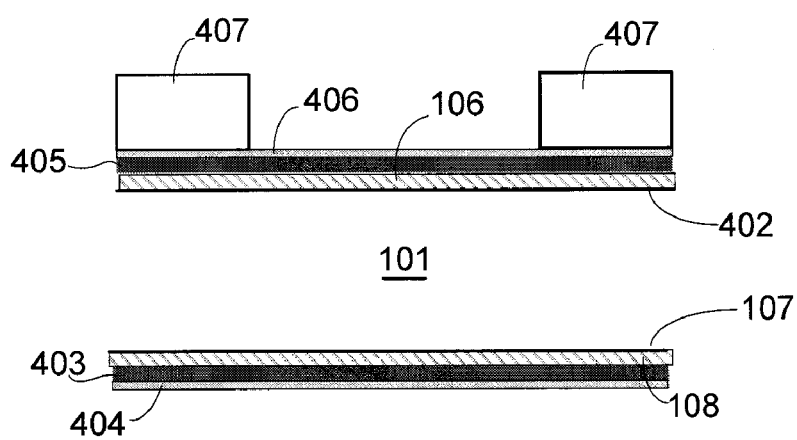

In FIG. 8, a mask 407 is formed on the capping layer 406 on the front side of the solar cell. The mask 407 defines and protects regions where metal contacts 102 will be formed during subsequent etching of the capping layer 406 and N-type dopant source 405.

Figure 9:
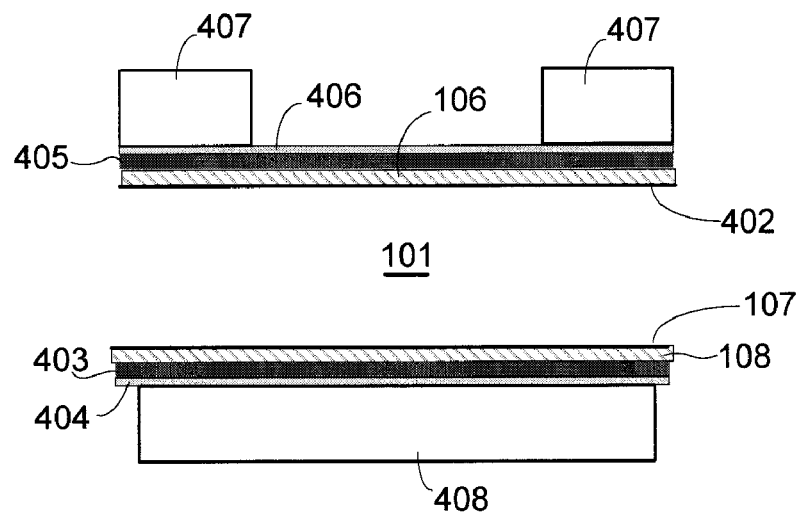

In FIG. 9, a mask 408 is formed on the capping layer 404 on the backside of the solar cell. The mask 408 protects the backside surface of the solar cell during etching of the capping layer 406 and the N-type dopant source 405 on the front side of the solar cell. In the example of FIG. 9, edges of the backside of the solar cell are not covered, i.e., exposed, by the mask 408 to allow for formation of an isolation trench on the edges of the solar cell. The masks 407 and 408 may comprise an acid resistance organic material, such as a resist, and formed using a printing process, such as screen printing or inkjet printing.

Figure 10:
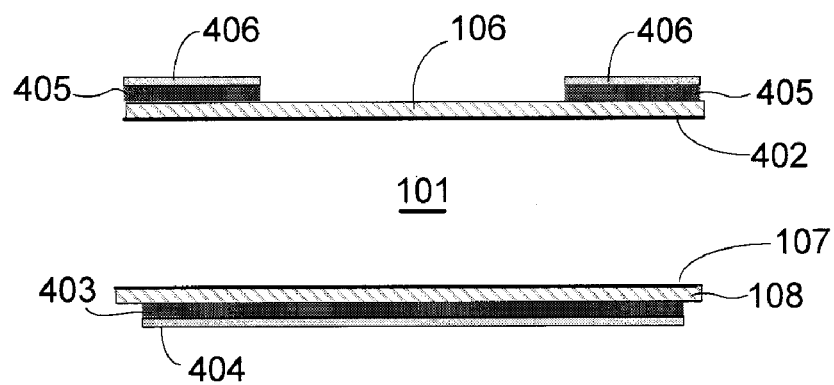

In FIG. 10, portions of the capping layer 406 and N-type dopant source 405 not covered by the mask 407 (see FIG. 9) and portions of the capping layer 404 and P-type dopant source 403 not covered by the mask 408 are etched in an oxide etch step. The oxide etch step exposes the region where the textured front side surface 113 (see FIG. 1) is subsequently formed. In one embodiment, the oxide etch step comprises a BOE (buffered oxide etch) process. The masks 407 and 408 are removed after the oxide etch step.

Figure 11:
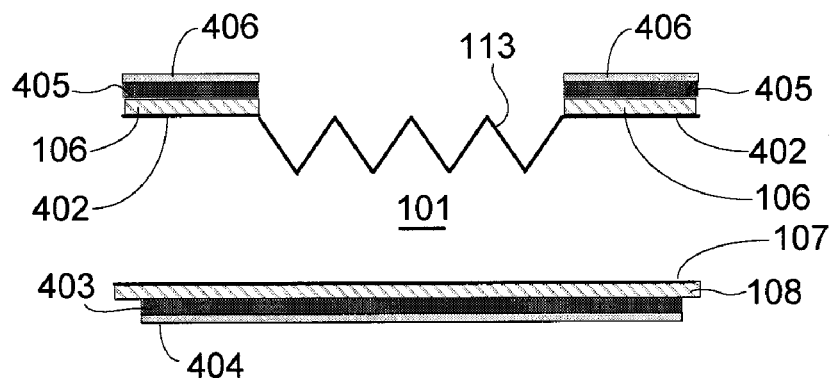

In FIG. 11, exposed portions of the substrate 101 on the front side are randomly textured to form the textured front side surface 113. In one embodiment, the front side surface of the substrate 101 is textured with random pyramids using a wet etch process comprising potassium hydroxide and isopropyl alcohol. The texturing process etches away exposed portions of the polysilicon layer 106.

Figure 12:
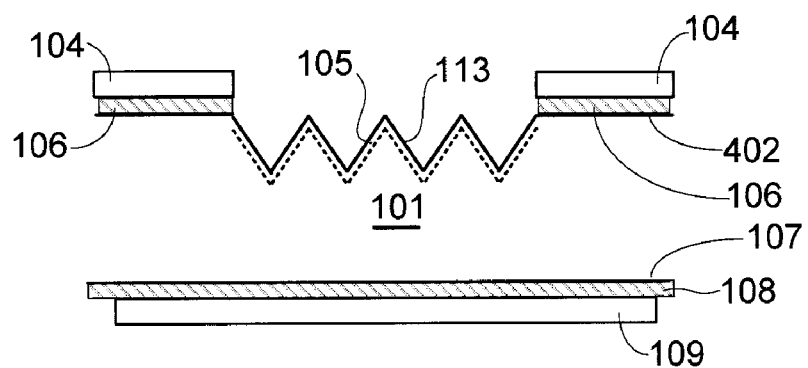

In FIG. 12, a dopant drive-in step is performed to diffuse N-type dopants from the N-type dopant source 405 (see FIG. 11) into the polysilicon layer 106, to diffuse P-type dopants from the P-type dopant source 403 to the polysilicon layer 108, and to diffuse N-type dopants into the front side of the substrate 101 to form the N-type doped region 105. Silicon dioxide layer 109 represents the P-type dopant source 403 and the capping layer 404 after the drive-in step. Similarly, silicon dioxide layer 104 represents the N-type dopant source 405 and the capping layer 406 after the drive-in step.

The polysilicon layer 108 becomes a P-type doped layer and the polysilicon layer 106 becomes an N-type doped layer after the drive-in step. The N-type doped region 105 may be formed by exposing the sample of FIG. 11 to phosphorus in the diffusion furnace during the drive-in step, for example. The use of the N-type dopant source 405, instead of simply exposing the polysilicon layer 106 in a phosphorus environment, advantageously allows for a more controlled and concentrated N-type diffusion to the N-type doped polysilicon layer 106. A passivating oxide layer (not shown in FIG. 11; see layer 135 in FIG. 1) may be grown on the textured surface 113 during the drive-in process.

In one embodiment, the drive-in step to dope the polysilicon layer 108 on the backside, to dope the polysilicon layer 106 on the front side, and to form the N-type doped region 105 may be formed in-situ, which in the context of the present disclosure means a single manual (i.e., by fabrication personnel) loading of the substrate 101 in a furnace or other single chamber or multi-chamber processing tool. In one embodiment, the drive-in step is performed in a diffusion furnace. The preceding sequence of steps leading to the drive-in step allows for in-situ diffusion, which advantageously helps in lowering fabrication cost.

Figure 13:
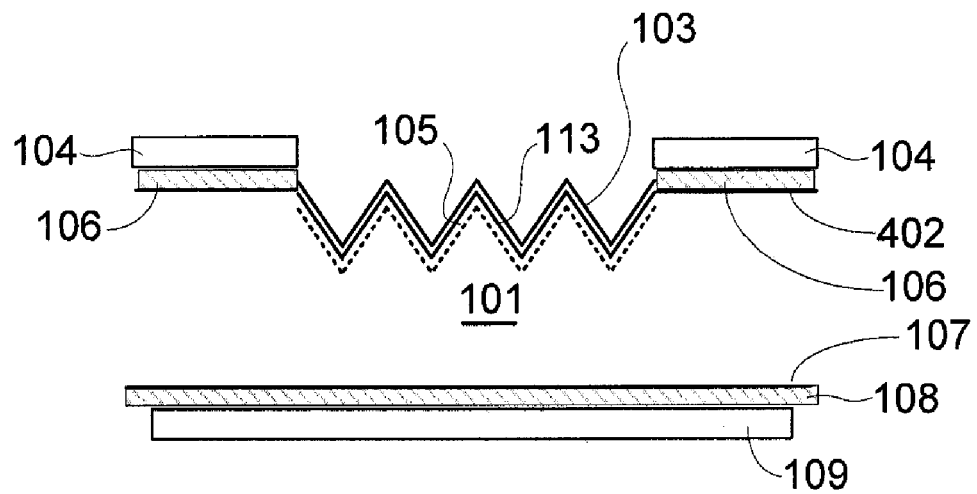

In FIG. 13, the antireflective coating of silicon nitride layer 103 is formed over the textured front side surface 113. The silicon nitride layer 103 may be formed to a thickness of about 450 Angstroms by PECVD, for example.

Figure 14:
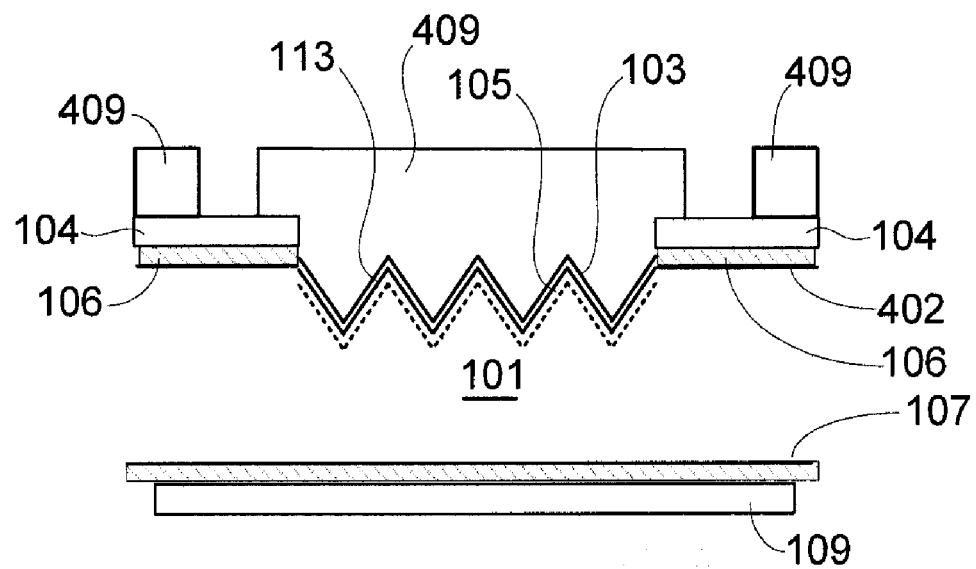

In FIG. 14, a mask 409 is formed on the front side of the solar cell. The mask 409 defines the regions where the contact holes 120 (see FIG. 1) will be subsequently formed.

Figure 15:
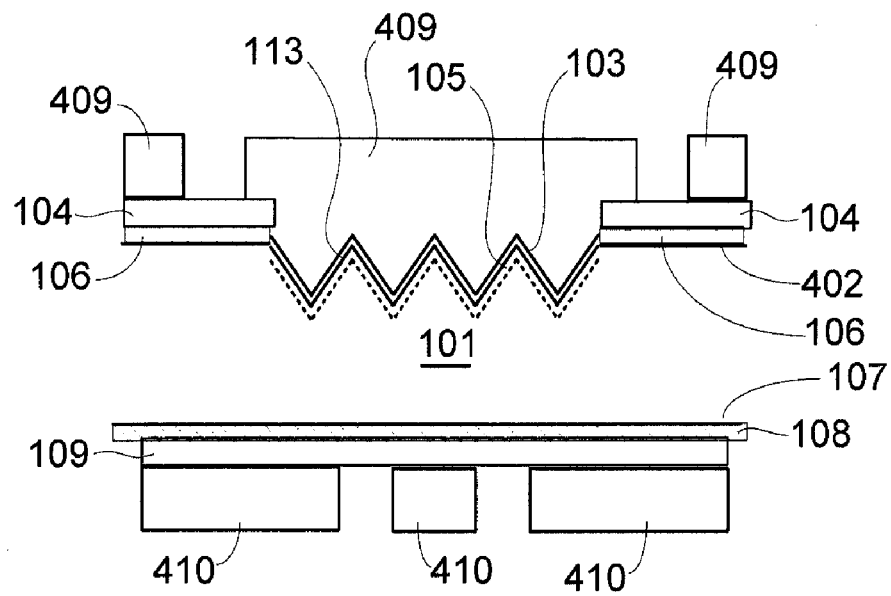

In FIG. 15, a mask 410 is formed on the backside of the solar cell. The mask 410 defines the regions where the contact holes 123 (see FIG. 1) will be subsequently formed. The masks 409 and 410 may comprise an acid resistance organic material, such as a resist, and formed using a printing process, such as screen printing or inkjet printing.

Figure 16:
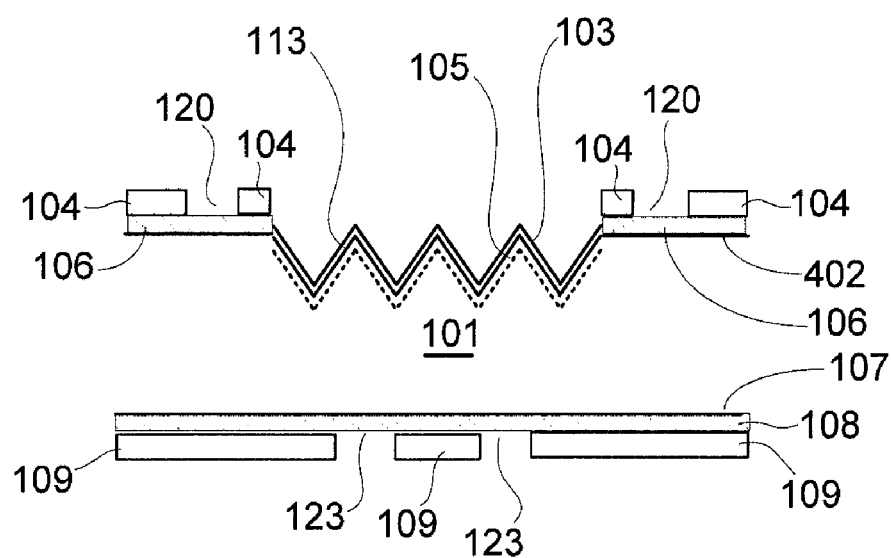

In FIG. 16, contact holes 120 and 123 are formed by removing portions of the silicon dioxide layers 104 and 109 exposed through the masks 409 and 410, respectively. In one embodiment, the contact holes 120 are formed by using a selective contact etch process that removes exposed portions of the silicon dioxide layer 104 and stops on the polysilicon layer 106. The same contact etch process removes exposed portions of the silicon dioxide layer 109 and stops on the polysilicon layer 108. In one embodiment, the contact etch process comprises a BOE (buffered oxide etch) process. The masks 409 and 410 are removed after the contact etch process.

Figure 17:
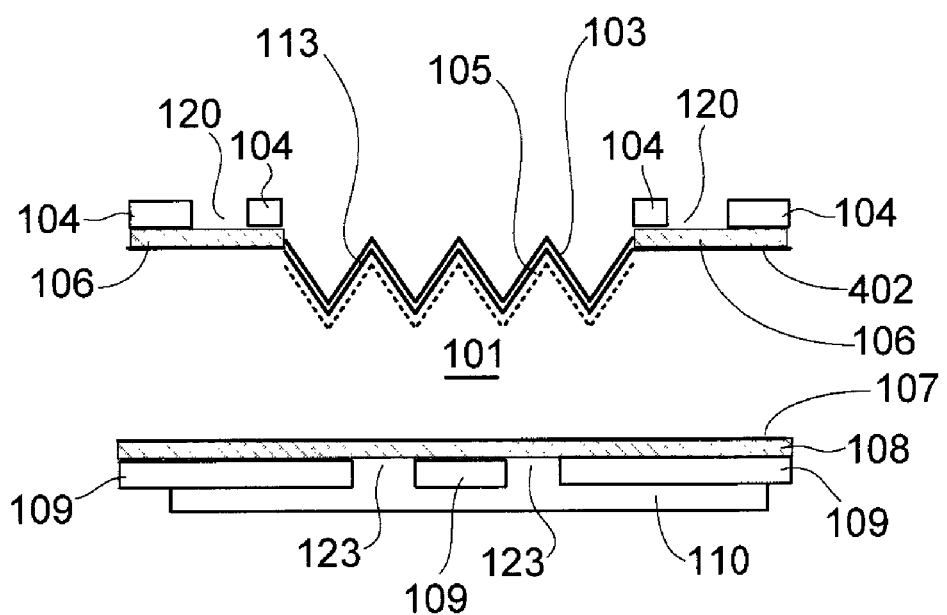

In FIG. 17, the metal contact 110 is formed on the silicon dioxide layer 109 to fill the contact holes 123 and make electrical connection to the polysilicon layer 108. The metal contact 110 may be formed using a printing process, such as screen printing. The metal contact 110 may comprise aluminum, which, together with the silicon dioxide layer 109, makes an excellent backside infrared reflector to increase solar radiation collection efficiency.

Figure 18:
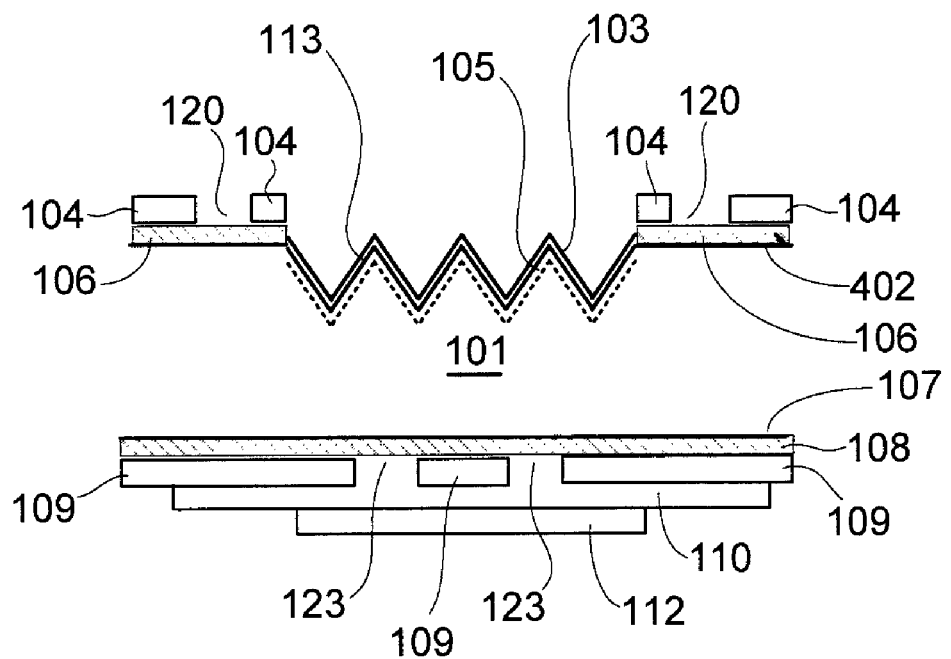

In FIG. 18, the metal contact 123 is formed on the metal contact 110 to make electrical connection to the polysilicon layer 108. The metal contact 123 may be formed using a printing process, such as screen printing. The metal contact 110 may comprise silver, for example.

Figure 19:
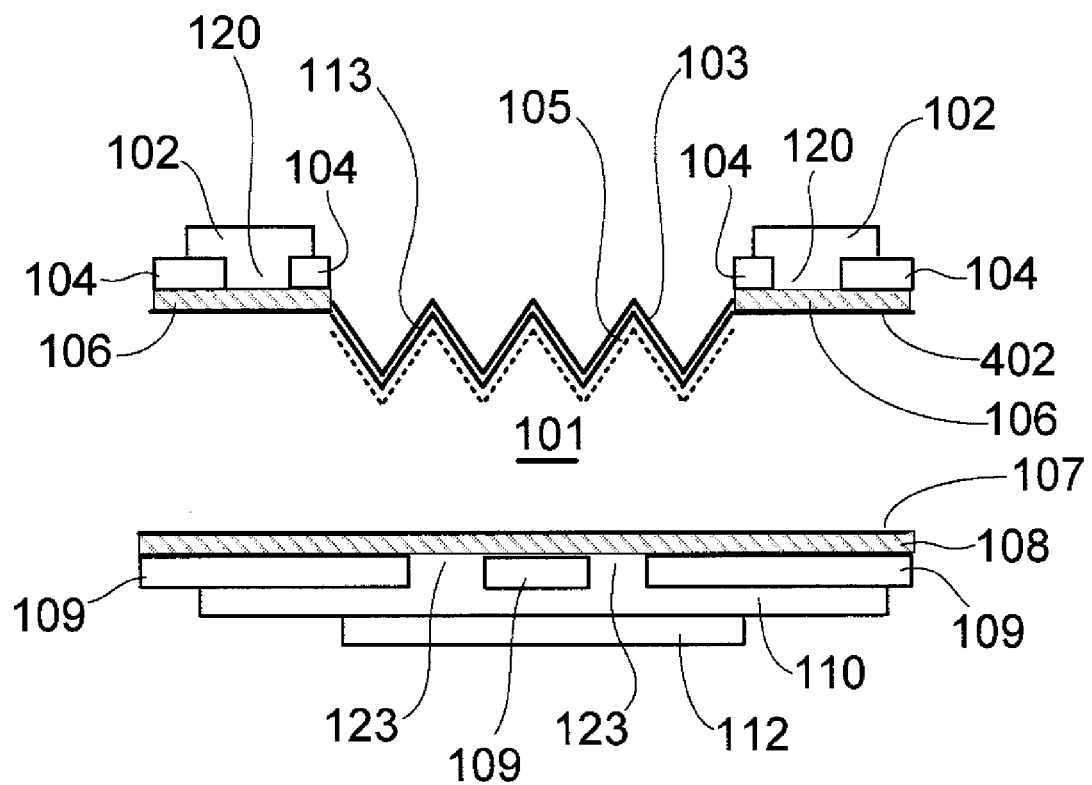

In FIG. 19, the metal contacts 102 are formed on the silicon dioxide layer 104 to fill the contact holes 120 and make electrical connection to the substrate 101 by way of the polysilicon layer 106. The metal contacts 120 may comprise silver and formed using a printing process, such as screen printing.

Formation of the metal contacts 102 and 110 may be followed by a firing step. The firing step is applicable when using screen printed silver paste as metal contacts, but not when using other processes or metals. The solar cell 100 may then be visually inspected and tested.

An improved front contact solar cell and method of manufacturing same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell having a front side facing the sun to collect solar radiation during normal operation and a backside opposite the front side, the solar cell comprising:
- a silicon substrate;
- a first layer of doped polysilicon formed over a back surface of the substrate, the first layer of doped polysilicon forming a backside junction with the substrate;
- a second layer of doped polysilicon formed over a front surface of the substrate, the second layer of doped polysilicon making an electrical connection to the substrate;
- a first silicon dioxide layer between the first layer of doped polysilicon and the back surface of the substrate;
- a second silicon dioxide layer between the second layer of doped polysilicon and the front surface of the substrate;
- a first metal contact making an electrical connection to the first layer of doped polysilicon on the backside of the solar cell;
- a second metal contact making an electrical connection to the second layer of doped polysilicon on the front side of the solar cell, the first metal contact and the second metal contact being configured to allow an external electrical circuit to be powered by the solar cell;
- a doped region under a textured portion of the front surface of the substrate, the doped region being of a same conductivity type as the second layer of doped polysilicon; wherein the dielectric layer is not the first silicon dioxide layer or the second silicon dioxide layer, and
- a dielectric layer formed over the first layer of doped polysilicon, and wherein the first metal contact comprises aluminum formed over the dielectric layer.

2. The solar cell of claim 1 further comprising an antireflective layer over the textured portion of the front surface of the substrate.

3. The solar cell of claim 2 wherein the antireflective layer comprises silicon nitride.

4. The solar cell of claim 1 wherein the substrate comprises an N-type silicon substrate, the first layer of doped polysilicon comprises a P-type doped polysilicon, and the second layer of doped polysilicon comprises an N-type doped polysilicon.

5. The solar cell of claim 1 wherein the first silicon dioxide layer is formed to a thickness between 10 and 50 Angstroms.

6. The solar cell of claim 1 further comprising a third metal contact formed over the first metal contact.

7. The solar cell of claim 1 wherein the first metal contact forms an infrared reflecting layer with the dielectric layer on the backside of the solar cell.

8. A solar cell having a front side facing the sun to collect solar radiation during normal operation and a backside opposite the front side, the solar cell comprising:
- an N-type silicon substrate;
- a textured surface on the N-type silicon substrate on the front side of the solar cell;
- an antireflective layer over the textured surface of the N-type silicon substrate;
- a P-type polysilicon layer forming a backside junction with the N-type silicon substrate;
- an N-type polysilicon layer over the front side of the solar cell;
- a first silicon dioxide layer between the N-type silicon substrate and the N-type polysilicon layer;
- a second silicon dioxide layer between the p-type polysilicon and the back surface of the substrate;
- a negative polarity metal contact making an electrical connection to the N-type polysilicon layer from the front side of the solar cell;
- a positive polarity metal contact making an electrical connection to the P-type polysilicon layer from the backside of the solar cell;
- an N-type doped region under the textured surface on the N-type silicon substrate on the front side of the solar cell; and
- a dielectric layer formed over the P-type polysilicon layer, wherein the dielectric layer is not the first silicon dioxide layer or the second silicon dioxide layer, and wherein the positive polarity metal contact comprises aluminum formed over the dielectric layer.

9. The solar cell of claim 8 wherein the antireflective layer comprises a layer of silicon nitride.

10. The solar cell of claim 8 further comprising a dielectric capping layer over the N-type polysilicon layer.

11. The solar cell of claim 8 wherein the positive polarity metal contact forms an infrared reflecting layer with the dielectric layer formed over the P-type polysilicon layer.

* * * * *